United States Patent [19]
Geller

[11] Patent Number: 5,502,298
[45] Date of Patent: Mar. 26, 1996

[54] APPARATUS AND METHOD FOR CONTROLLING AN EXTINCTION RATIO OF A LASER DIODE OVER TEMPERATURE

[75] Inventor: William L. Geller, Foster City, Calif.

[73] Assignee: Ericsson Raynet, Menlo Park, Calif.

[21] Appl. No.: 244,983

[22] PCT Filed: Dec. 21, 1992

[86] PCT No.: PCT/US92/11157

§ 371 Date: Aug. 22, 1994

§ 102(e) Date: Aug. 22, 1994

[87] PCT Pub. No.: WO93/13577

PCT Pub. Date: Jul. 8, 1993

[51] Int. Cl.⁶ .................................................. H04B 10/04
[52] U.S. Cl. ............................ 250/205; 359/187; 372/31
[58] Field of Search ............................... 250/205, 214 C, 250/238; 372/26, 29, 31, 33, 38; 359/118, 119, 120, 121, 126, 157, 167, 180, 187

[56] References Cited

U.S. PATENT DOCUMENTS

| | | | |
|---|---|---|---|
| 4,369,525 | 1/1983 | Breton et al. | 372/31 |
| 4,471,494 | 9/1984 | Keil et al. | 359/187 |
| 4,580,044 | 4/1986 | Hongo et al. | 250/205 |
| 4,689,795 | 8/1987 | Yoshimoto et al. | 372/31 |
| 4,709,416 | 11/1987 | Patterson | 359/118 |
| 4,718,118 | 1/1988 | Viola | 359/180 |
| 4,853,934 | 8/1989 | Sakurai | 250/205 |
| 4,985,896 | 1/1991 | Kimizuka et al. | 372/38 |
| 4,995,045 | 2/1991 | Burley et al. | 372/38 |
| 4,995,105 | 2/1991 | Wechsler | 372/38 |
| 5,027,362 | 6/1991 | Hokanson et al. | 372/38 |
| 5,036,189 | 7/1991 | Geller | 250/205 |
| 5,065,456 | 11/1991 | Nakayama | 359/187 |
| 5,091,797 | 2/1992 | Proebster | 359/187 |
| 5,311,005 | 5/1994 | Visocchi | 250/205 |
| 5,394,416 | 2/1995 | Ries | 372/26 |

FOREIGN PATENT DOCUMENTS 0428016  5/1991  European Pat. Off. .

OTHER PUBLICATIONS

Japanese Patent Abstract, Publication No. 63 280 482 (NEC Corp).
Japanese Patent Abstract, Publication No. 59 063 787 (Fujitsu KK).
Japanese Patent Abstract, Publication No. 61 052 042 (Hitachi Ltd).

Primary Examiner—Edward P. Westin
Assistant Examiner—John R. Lee
Attorney, Agent, or Firm—Lyon & Lyon

[57] ABSTRACT

A circuit for controlling an extinction ratio of a laser whose temperature can change over time includes first and second feedback loops which monitor a LOW output power of the laser during a first frame training pulse and a HIGH laser output power during a second frame training pulse. The LOW power output is compared to a preset dynamic LOW power reference, and a LOW bias current applied to the laser is incrementally increased or decreased so as to keep this LOW power output toggling about this LOW reference. Similarly, the HIGH power output is compared to a HIGH power reference, and a modulation current for the laser is incrementally increased or decreased to keep the HIGH laser output power toggling about this HIGH reference. Preferably, the training pulse is sent once per frame thus enabling both the LOW and HIGH laser output powers to be kept constant regardless of whatever dynamic variables may change over time thus keeping the laser extinction ratio constant.

15 Claims, 7 Drawing Sheets

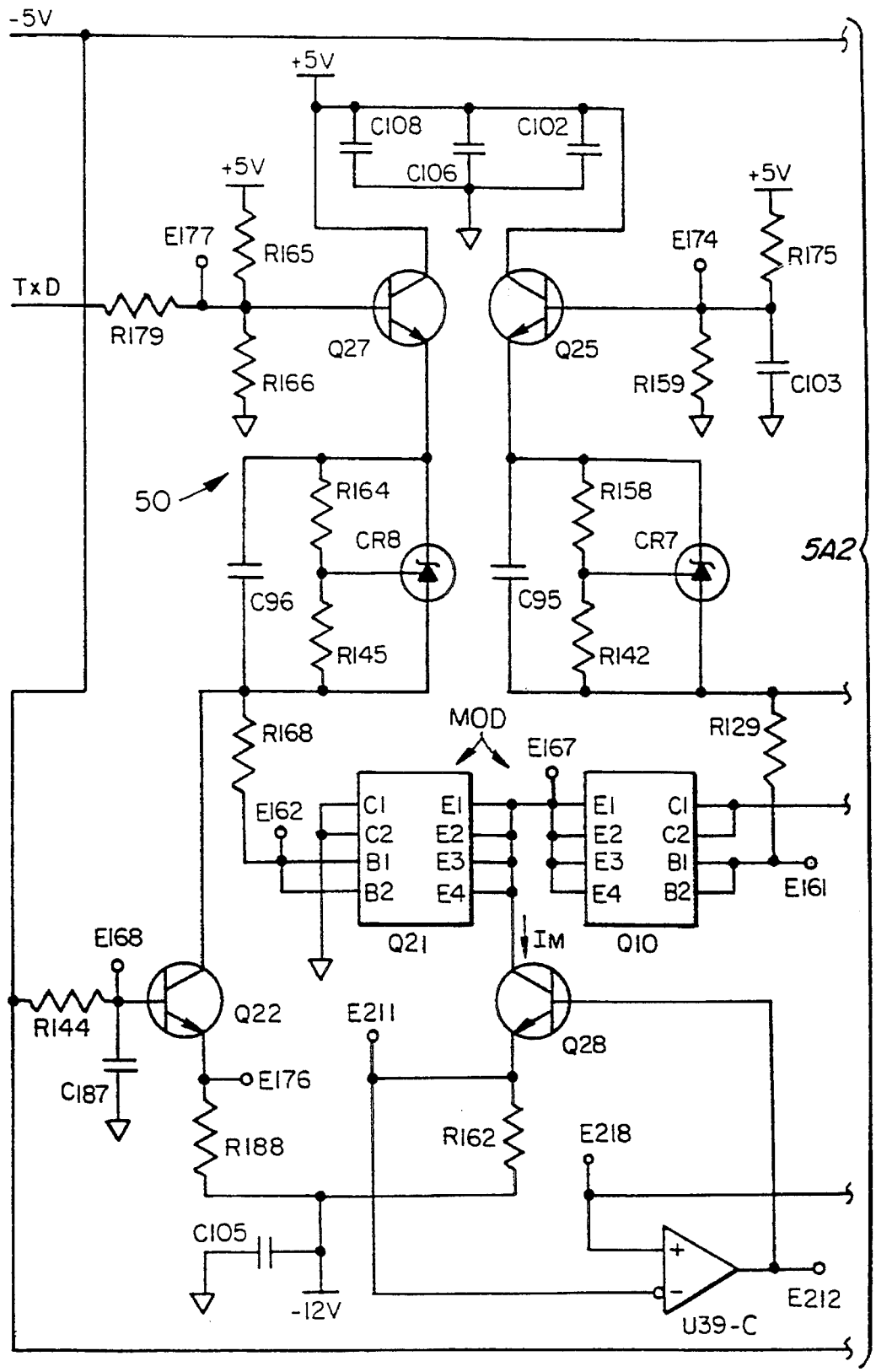
Fig. 5A1

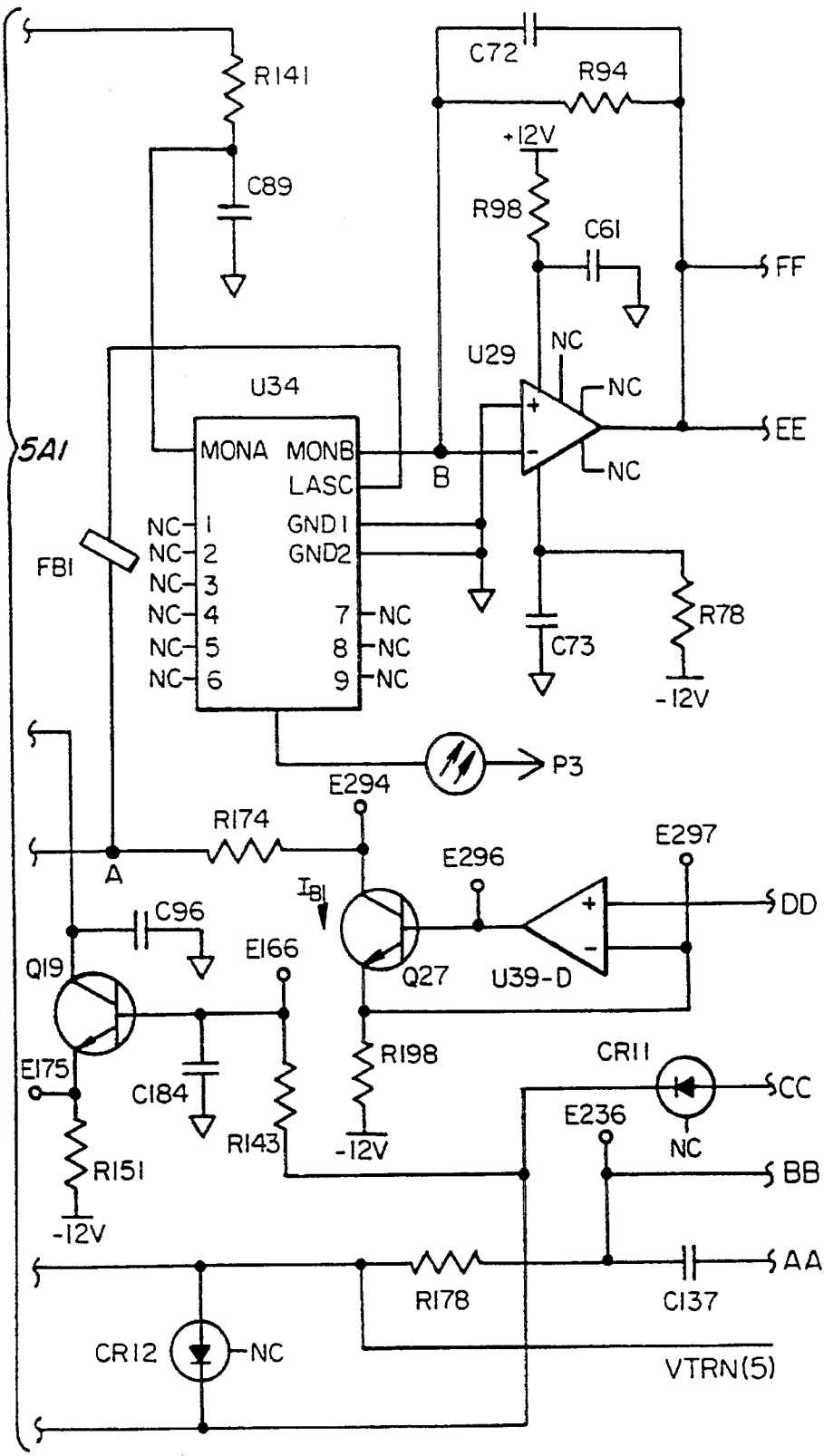
Fig. 5A2

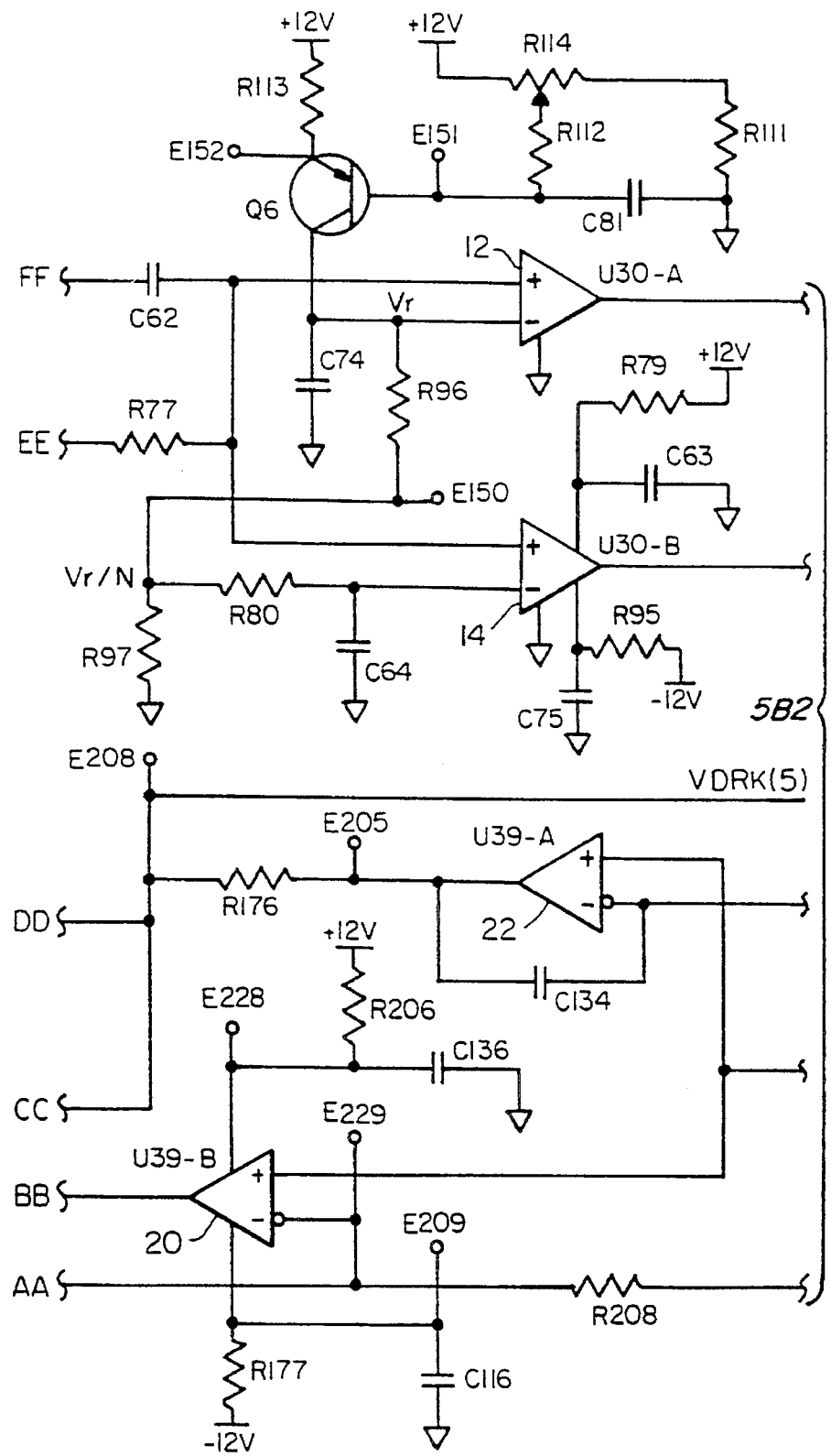
Fig. 5B1

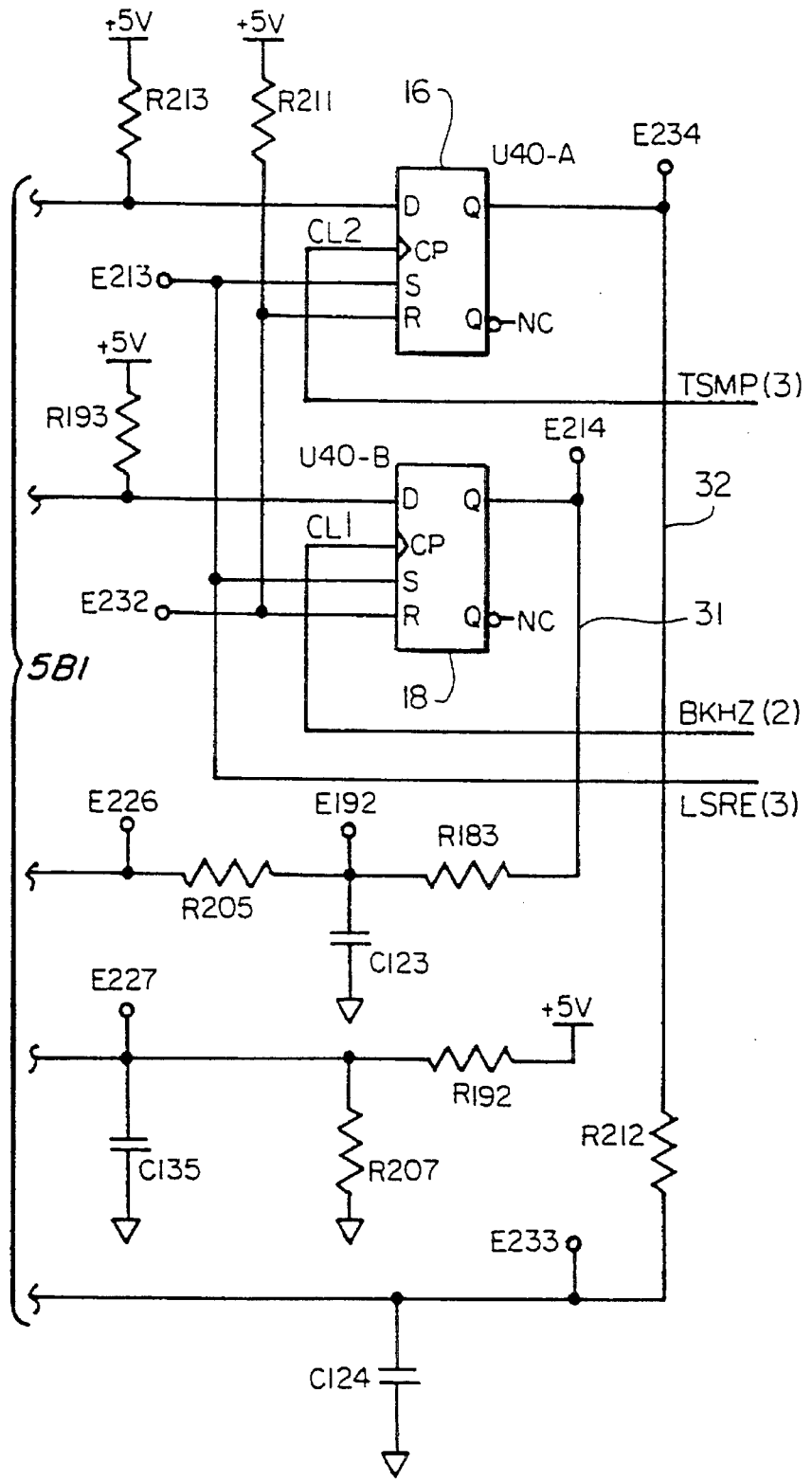
*Fig. 5B2*

APPARATUS AND METHOD FOR CONTROLLING AN EXTINCTION RATIO OF A LASER DIODE OVER TEMPERATURE

BACKGROUND OF THE INVENTION

The present invention relates to an apparatus for controlling an output of a laser diode over temperature so as to control and optimally maintain constant its extinction ratio, and a method for initially setting HIGH and LOW outputs of the laser diode so as to have a desired extinction ratio.

Various control circuits have been proposed in the prior art for maintaining an output of a laser diode. FIG. 1 illustrates various characteristic curves for a laser diode whereby current I versus power P is graphed, the three curves illustrating data for a laser diode at three distinct temperatures. As is evident and known, a pedestal bias current 4 of the laser diode increases with temperature. One method of controlling an output of a laser diode is to incorporate a thermoelectric cooler into a laser package so as to keep the diode at a constant temperature so that its pedestal bias current remains constant. Accordingly, an extinction ratio of the laser diode, defined as the ratio between its HIGH power output divided by its LOW power output can easily be maintained constant. A disadvantage of such proposals is that thermoelectric cooler designs tend to increase the laser cost, and decreases reliability of the laser diode since any failure in the thermoelectric cooler device or its circuitry will result in the applied bias current being inappropriate as the temperature of the laser diode varies.

Circuits have also been proposed whereby a LOW pedestal power is monitored successively over time for the laser diode and incrementally increased or decreased in response to comparison to a preset dynamic threshold. One such circuit is described by Geller, U.S. Pat. No. 5,036,189, assigned to the assignee of the present invention, the disclosure of which is incorporated herein by reference. Though the Geller circuit readily establishes and maintains an appropriate LOW pedestal bias current, it does not control the HIGH power output of the laser. Referring back to FIG. 1, since a slope of the current versus power output of a laser changes over temperature, for a constant modulation current $I_M$, the laser extinction ratio (the ratio between the laser HIGH power divided by the laser LOW power) will change over time. If the extinction ratio becomes too small, increased noise results at an optical receiver detecting an output of the laser which results in undesirable bit errors.

It has also been proposed to utilize circuitry which maintains the average laser modulation power constant over time. Such circuits also suffer from a disadvantage that the laser output extinction ratio will change with temperature. Specifically, referring to FIG. 1, curve 3 illustrates how such circuitry works on an output of the laser and illustrates that noise detected by the receiver when the laser emits a LOW output is undesirably high, i.e. greater than the power output at the laser threshold pedestal.

SUMMARY OF THE INVENTION WITH OBJECTS

It is an object of the present invention to eliminate the above noted drawbacks in laser design and provide an apparatus whereby an extinction ratio of a laser output is maintained constant over various temperatures.

It is a further object of the invention to provide a laser whereby its LOW bias power is monitored and adjusted over time to maintain the laser at a predetermined pedestal bias output threshold value, and independently monitor the HIGH output level of the laser and keep that output at another predetermined value, periodically over time, so as to achieve stability over temperature.

These and other objects of the invention are achieved by a circuit for controlling an extinction ratio of an output of a laser which is not maintained at a constant temperature, comprising:

first means for detecting a first magnitude of a voltage representative of a magnitude of an intensity of optical radiation emitted by a light source while the light source is transmitting a continuous logical 1, the logical 1 being transmitted sufficiently long to achieve a stabilized constant value for the first voltage magnitude which is detected;

second means for detecting a second magnitude of a voltage representative of a magnitude of an intensity of optical radiation emitted by the light source while the light source is transmitting a continuous logical 0, the logical 0 being transmitted sufficiently long to achieve a stabilized constant value for the second voltage magnitude;

first means for comparing the first voltage magnitude to a first preset voltage value representative of a preset desired modulation current while the light source is transmitting the continuous logical 1 and then adjusting the modulation current of the light source in response to the first means comparison to maintain the first voltage magnitude in close proximity to the first preset value;

second means for comparing the second voltage magnitude to a second preset voltage value representative of a preset desired bias current while the light source is transmitting the continuous logical 0 and then adjusting the bias current of the light source in response to this second means comparison to maintain the second voltage magnitude in close proximity to the second preset value;

the first and second detecting means detecting the first and second voltage magnitudes and the first and second comparing means adjusting the modulation and bias currents respectively over time at a frequency which is sufficiently large so as to maintain an extinction ratio of the light source relatively constant as an efficiency of the light source varies over time.

According to another aspect of the invention, a method is disclosed for optimally initially setting the HIGH and LOW levels of a laser diode, the method preferably comprising the steps of:

setting a first voltage level representative of a magnitude of optical radiation emitted by a laser transmitting a logical 1 substantially equal to a first reference level;

setting a second voltage level representative of a magnitude of optical radiation emitted by the laser transmitting a logical 0 substantially equal to a second reference level;

simultaneously adjusting the first and second reference levels while maintaining a ratio therebetween constant until a desired laser power output is obtained.

These and other objects will be further described by reference to the following detailed description and drawings.

BRIEF DESCRIPTION OF THE DRAWINGS

FIGS. 5A and 5B together illustrate a preferred circuit implementation of the schematic illustrated in FIG. 3;

DETAILED DESCRIPTION OF THE PREFERRED EMBODIMENTS

Figure 1:
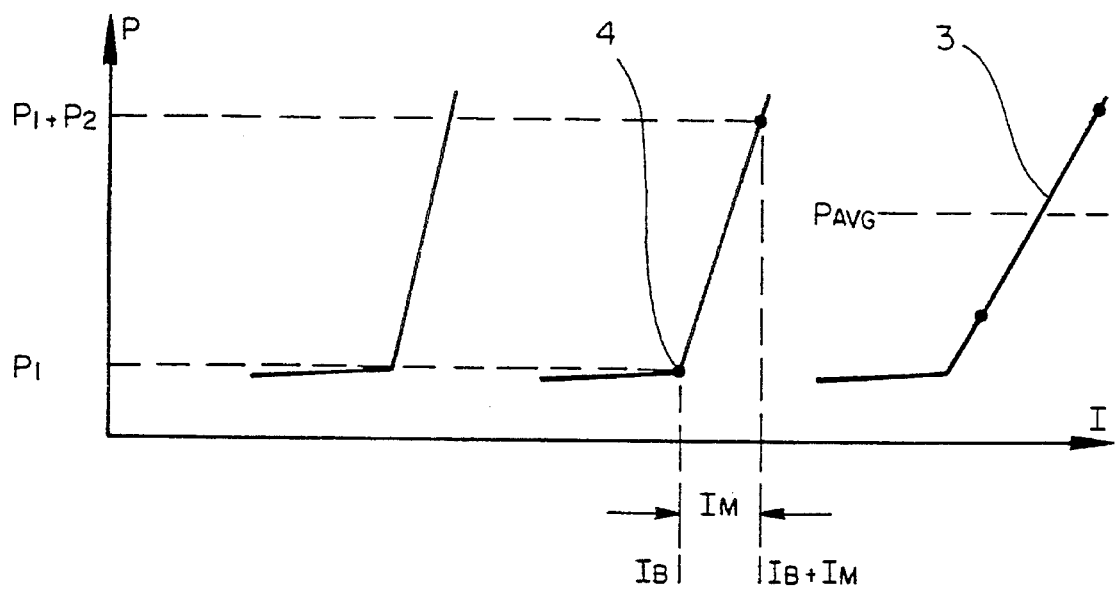
FIG. 1 illustrates several current versus power characteristic curves of a laser at various temperatures and shows bias and modulation current values.

According to the invention, a circuit is provided for independently monitoring a pedestal bias output power $P_1$ (FIG. 1) of a laser periodically over time, independently monitoring a HIGH power output $P_1+P_2$ of the laser over time, and independently increasing or decreasing these powers over time so that an extinction ratio of the laser is maintained constant and the laser LOW power is kept at its pedestal point.

As indicated, the extinction ratio N is defined as the HIGH laser output power $P_1+P_2$ divided by the LOW laser output power $P_1$. For N greater than 10, the extinction ratio is approximated by $P_2/P_1$.

Figure 2:
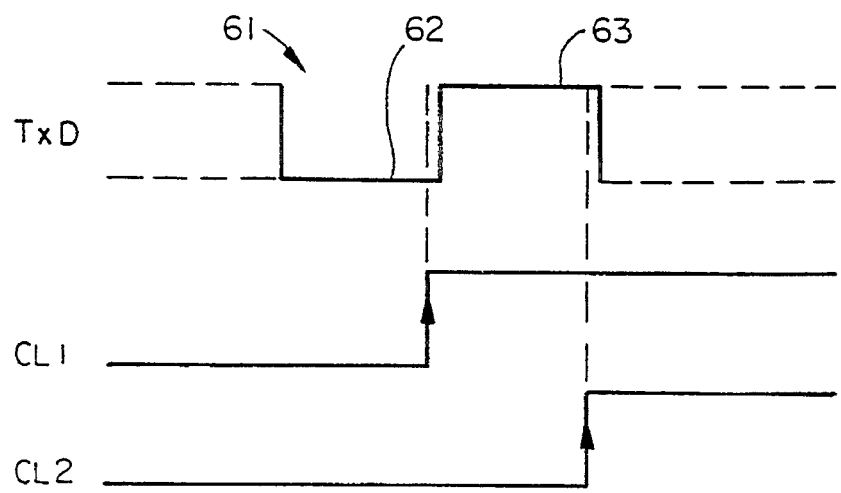
FIG. 2 illustrates a preferred frame preamble and clock times for use with the present invention.

Referring to FIG. 2, a control circuit is proposed for use for information frames 61 which preferably include training pulses 62, 63, the training pulses comprising several successive binary LOWs followed by several successive binary HIGHs, preferably the successive LOWs and HIGHs each comprising a byte or more of bandwidth (typically 8 bits, or 10 bits for 4B5B coding of 8 bit bytes). According to a preferred embodiment, this LOW-HIGH training pulse is transmitted once per frame. At an appropriate instant near an end of the successive binary LOW period, the laser power output is strobed by clock CL1 and measured and compared to a preset dynamic LOW power reference value. If the measured LOW power is below the preset dynamic LOW power reference value, a bias current $I_B$ to the laser is incrementally increased. Similarly, any time the strobed and measured power is above the preset dynamic LOW power reference value, the pedestal bias current is incrementally decreased. It is readily evident that if this done repetitively, the bias current supplied to the laser can be readily adjusted so as to keep the bias current at the laser pedestal threshold regardless of the speed with which the pedestal may move as induced by laser aging or more commonly due to temperature variations. According to a preferred embodiment, as indicated, this measurement and comparison is done once per frame, and at a frame rate of 8 KHz, 8,000 bias current adjustments per second are achievable. Accordingly, the bias current will toggle about the LOW power reference value.

In addition, similarly at an appropriate instant near an end of the successive binary HIGH training pulse period, the laser power is again strobed by clock CL2, measured, and compared to another preset dynamic HIGH power reference value and when the strobed and measured power is below the preset HIGH reference value a modulation current $I_M$ to the laser is increased and whenever it is above the preset HIGH reference value the modulation current $I_M$ is decreased. Accordingly, the modulation current will also toggle about a desired level. Hence both the HIGH power output and LOW power output are independently measured and compared repetitively over time keeping these values relatively constant so as to maintain the laser extinction ratio constant.

Figure 3:
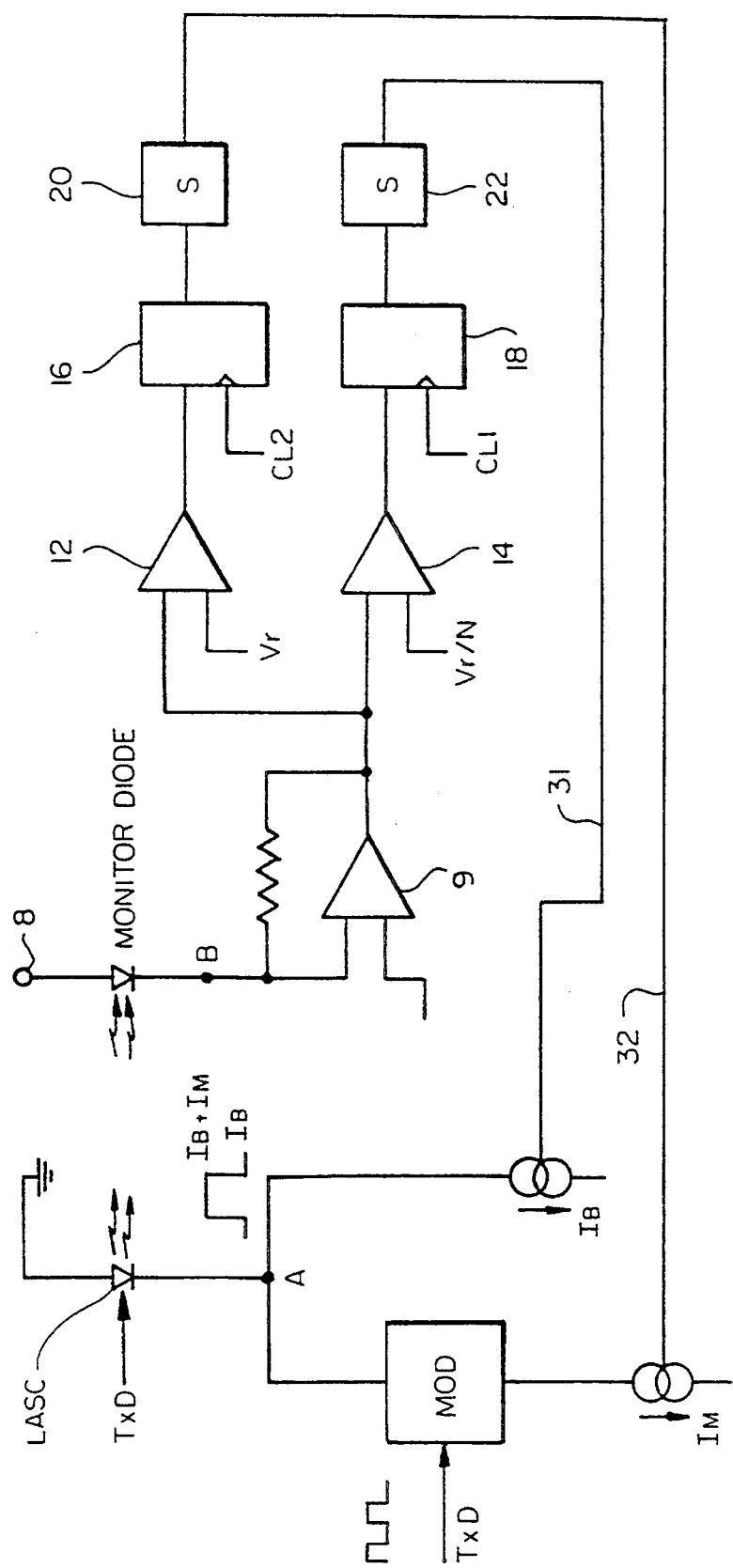
FIG. 3 illustrates a schematic of one embodiment of the invention for maintaining an extinction ratio of a laser constant.

FIG. 3 illustrates a schematic illustration of one preferred embodiment of the invention. Referring to this figure, laser diode LASC to be controlled has its anode connected to junction A which in turn is connected in parallel to first and second current sources $I_M$ and $I_B$. The laser diode anode is connected to the current source $I_M$ through a switch MOD having a data input TxD which completes a path between the anode and the current source $I_M$ only during HIGH output frame periods of the laser. Light emitted by the laser diode is monitored, preferably via a back facet of the laser diode, by a monitor diode connected to a bias voltage 8. A current output of an anode B of the monitor diode is converted to a voltage by a transimpedance amplifier 9 which is connected to first and second control circuits 32, 31. Each control circuit includes a comparator 12, 14, a flip-flop 16, 18, having clock inputs CL2 and CL1 respectively, and a current integrator 20, 22. The control loop 31 is connected to the constant current source $I_B$, and the control loop 32 is connected to the other constant current source $I_M$.

In operation, during the LOW training pulse, switch MOD is open so anode A is connected to only the pedestal current source $I_B$. Current from the laser output anode B is converted to a voltage by the amplifier 9 and presented to the comparator 14. Upon being strobed by CL1 by the flip-flop 18, the comparator puts out a HIGH or LOW pulse depending on whether or not the amplifier voltage is above or below the threshold $V_R/N$. This pulse is utilize by the integrator 22 to either decrease or increase a value of $I_B$ so as to maintain the LOW power output of the laser constant and toggling about the dynamic reference established by $V_R/N$.

During the HIGH training pulse, switch MOD is closed so that the laser LASC anode A is connected to both the current source $I_M$ and $I_B$. An output of the laser LASC is monitored by the monitor diode, and a current from its anode B is again convened to a voltage by the amplifier 9 and presented to the comparators 12, 14. Upon being strobed by CL2, the flip-flop 16 causes the voltage at comparator 12 to be compared to the predetermined HIGH reference voltage $V_R$, and the resultant comparison is inputted to the integrator 20 to adjust $I_M$ up or down to keep the HIGH laser output toggling about its reference value.

As can be appreciated, the reference voltages $V_R$ and $V_R/N$ of the comparators 12, 14 readily result in a laser extinction ratio which is approximately equal to N.

According to another aspect of the invention, the laser control circuit of the present invention is very easy to optimize and set prior to being used for transmitting information. Specifically, according to the invention, the reference voltages $V_r$ and $V_r/N$ are maintained in a fixed ratio by being connected to a voltage divider network, i.e. a pair of resistors in series, as is well understood in the art, and accordingly by simply adjusting an input voltage to the voltage divider network one can easily adjust both the LOW power output and the HIGH power output of the laser simultaneously without varying the laser extinction ratio. Hence, with a single adjustment, the laser output can be optimized so as to achieve the desired extinction ratio N. Prior art lasers typically require multiple adjustments for setting a bias power and a HIGH power. An example of a preferred voltage divider network is illustrated in FIG. 5B by resistors R96, R97 which form a voltage divider network for reference voltages inputted to comparators 12, 14.

Figure 4:
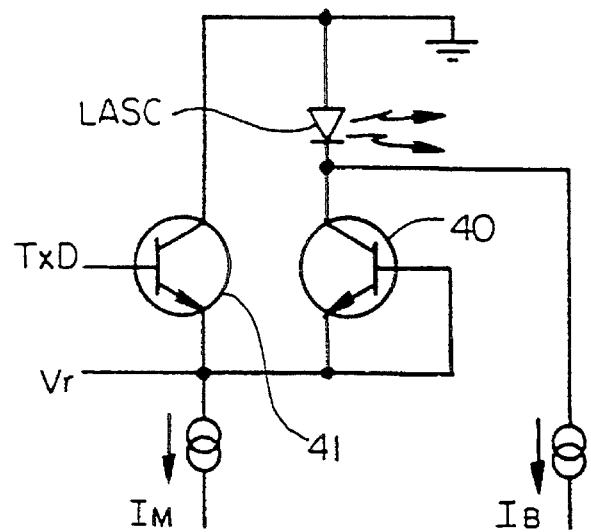
FIG. 4 illustrates a switch modulator shown in FIG. 3.

FIG. 4 shows one preferred embodiment of the switch MOD, the switch comprising first and second transistors 40, 41, a current source $I_M$ being connected to their common anodes, and their cathodes being connected to the laser LASC being modulated, as shown. During periods of HIGH output pulses for the laser LASC, transistor 41 is enabled so that the laser LASC is biased by the threshold current $I_B$ and the modulation current $I_M$, and when a LOW pulse is to be generated by the laser LASC the transistor 41 is disabled so that the anode A of the laser is only connected to the pedestal current $I_B$.

FIGS. 5A and 5B illustrate a detailed preferred electrical schematic of a circuit according to the invention. For ease of illustration, elements in FIG. 5A and 5B which perform the functions referred to in FIG. 3 are identified by identical reference symbols in each of these figures. Referring to FIG. 5A, since it is preferred to have a cathode of the laser LASC connected to ground and since TXD data is assumed to be received from an electrical bus at levels of +5V and 0V, a voltage converter 50 is provided for converting the TxD voltages from 5V and 0V to 0V and –5V respectively. These converted voltages are then inputted to the switch MOD which selectively connects the laser anode with the constant current $I_M$ as described during HIGH periods. An output B of the monitor laser is connected to the transimpedance amplifier 9 which is then connected to first and second feedback paths 32, 31 each having a comparator, flip-flop, and integrator, as previously described. Feedback loop 31 which includes the comparator 14, flip-flop 18, and integrator 22, controls the pedestal current $I_B$, and the comparator 12, flip-flop 16, and integrator 20 of the feedback loop 32 control the modulation current $I_M$. As is evident by examining FIG 5B, N equals the resistance of R96 divided by the resistance of R97.

Figure 6:
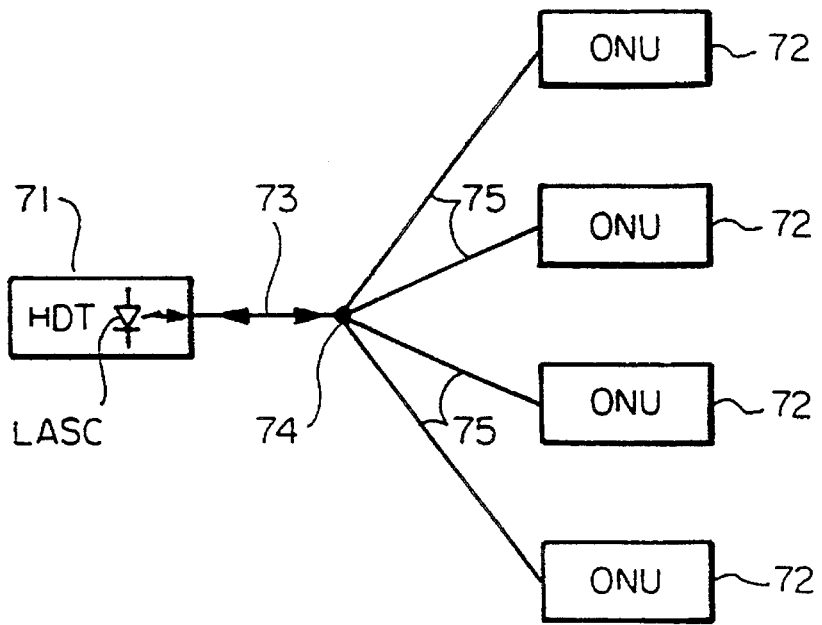
FIG. 6 illustrates a plurality of optical network units connected to a host digital terminal which includes a laser controlled according to the invention.

FIG. 6 illustrates a preferred use for the invention, this figure showing a host digital terminal 71 connected to a plurality of optical network units 72 via at least one optical fiber 73 which preferably transports bidirectional traffic. A splitter/combiner 74 splits a signal originating from the host digital terminal from the fiber 73 to a plurality of additional fibers 75 for transmission to each optical network unit, and conversely signals from each optical network unit 72 are combined at the point 74 so as to be transported to the host digital terminal via the fiber 73. With such an architecture, high receiver sensitivity for each optical network unit is enhanced by maintaining an extinction ratio of a laser transmitting from the host digital terminal at a relatively high level, preferably above 10.

Though the invention has been described by reference to certain preferred embodiments thereof, it should be understood that various modifications can be made thereto without departing from the spirit and scope of the invention, and accordingly the invention is to be limited only by the appended claims.

What is claimed is:

1. An optical transmission system including a laser light source, comprising:

means for detecting a first voltage magnitude representative of an intensity of optical radiation emitted by the laser light source while transmitting at a first output power level, the first output power level corresponding to the transmission of a logical 1;

means for adjusting the first output power level of the laser light source to maintain the first voltage magnitude in close proximity to a first preset voltage value;

means for detecting a second voltage magnitude representative of an intensity of optical radiation emitted by the laser light source while transmitting at a second output power level, the second output power level corresponding to the transmission of a logical 0; and means for adjusting the second output power level of the laser light source to maintain the second voltage magnitude in close proximity to a second preset voltage value.

2. The optical transmission system of claim 1, the laser light source comprising a digital data modulated laser which emits optical energy in recurrent frames within a time division multiplexed optical communications network.

3. The optical transmission system of claim 1, the first and second detecting means comprising a current-to-voltage converter which converts a current representative of the optical radiation output of the laser light source into a corresponding voltage.

4. The optical transmission system of claim 1, further comprising means for simultaneously adjusting the first and second preset voltage values while maintaining constant the ratio of the first preset value to the second preset value.

5. The optical transmission system of claim 4, the means for simultaneously adjusting the first and second preset voltage values comprising a resistive voltage divider network.

6. The optical transmission system of claim 1, the means for adjusting the first output power level including a first comparator for comparing the first voltage magnitude to the first preset voltage value and means for responsively adjusting a modulation current of the laser light source to maintain the first voltage magnitude in close proximity to the first preset value.

7. The optical transmission system of claim 6, the means for adjusting the second output power level including second comparator for comparing the second voltage magnitude to the second preset voltage value and means for responsively adjusting a bias current of the laser light source to maintain the second voltage magnitude in close proximity to the second preset value.

8. The optical transmission system of claim 7, further comprising first and second flip-flops for strobing the first and second comparators at times corresponding to transmissions by the laser light source of continuous logical 0 and logical 1 signals, respectively.

9. The optical transmission system of claim 8, the continuous logical 1 and logical 0 signals each comprising non-data carrying training pulses, each at least 6 bits in length and each embedded within select frames.

10. The optical transmission system of claim 8, the continuous logical 1 being transmitted sufficiently long to achieve a stabilized constant value for the detected first voltage magnitude, the continuous logical 0 being transmitted sufficiently long to achieve a stabilized constant value for the detected second voltage magnitude.

11. The optical transmission system of claim 7, the first and second detecting means detecting the first and second voltage magnitudes and the first and second adjustment means adjusting the modulation and bias currents, respectively, at a frequency which is sufficiently high so as to maintain a relatively constant extinction ratio of the laser light source over time and temperature.

12. The optical transmission system of claim 7, the first and second adjusting means increasing the modulation and bias currents when the detected first and second voltage magnitudes are below the first and second preset voltage values, respectively, and decreasing the modulation and bias currents when the detected first and second voltage magnitudes are above the first and second preset voltage values, respectively.

13. A method of setting the output power of a digital laser, comprising the steps of:

detecting a first voltage magnitude representative of an intensity of optical radiation emitted by the laser while transmitting at a HIGH output power level, the HIGH output power level corresponding to the transmission of a logical 1;

adjusting the HIGH output power level of the laser to maintain the first voltage magnitude in close proximity to a first preset voltage value;

detecting a second voltage magnitude representative of an intensity of optical radiation emitted by the laser while transmitting at a LOW output power level, the LOW output power level corresponding to the transmission of a logical 0; and adjusting the LOW output power level of the laser to maintain the second voltage magnitude in close proximity to a second preset voltage value.

14. The method of claim 13, further comprising the step of:

simultaneously adjusting the first and second preset voltage values while maintaining constant the ratio of the first preset value to the second preset value, until a desired laser power output is obtained.

15. The method of claim 14, the ratio between the first and second reference levels being maintained by a resistive voltage divider.

* * * * *